United States Patent
Walder

(10) Patent No.: US 12,406,822 B2
(45) Date of Patent: Sep. 2, 2025

(54) FASTENER FOR SECURING FACEPLATE TO ION SOURCE

(71) Applicant: Applied Materials, Inc., Santa Clara, CA (US)

(72) Inventor: John Alexander Walder, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 365 days.

(21) Appl. No.: 18/144,367

(22) Filed: May 8, 2023

(65) Prior Publication Data

US 2024/0379319 A1 Nov. 14, 2024

(51) Int. Cl.
 *H01J 37/08* (2006.01)
 *H01J 37/30* (2006.01)
 *H01J 37/317* (2006.01)

(52) U.S. Cl.
 CPC .......... *H01J 37/08* (2013.01); *H01J 37/3002* (2013.01); *H01J 37/3171* (2013.01)

(58) Field of Classification Search
 None
 See application file for complete search history.

(56) References Cited

U.S. PATENT DOCUMENTS

| | | | |
|---|---|---|---|
| 9,859,098 B2 * | 1/2018 | Holden | H01J 37/3171 |
| 10,325,752 B1 | 6/2019 | Calkins et al. | |
| 10,347,457 B1 * | 7/2019 | Perel, Sr. | H01J 37/30 |
| 2002/0130278 A1 | 9/2002 | Vella | |
| 2007/0107841 A1 | 5/2007 | Horsky et al. | |
| 2008/0067412 A1 * | 3/2008 | Vanderberg | H01J 37/304 250/427 |
| 2015/0130353 A1 | 5/2015 | Lin et al. | |
| 2015/0179393 A1 | 6/2015 | Colvin et al. | |

(Continued)

FOREIGN PATENT DOCUMENTS

| | | |
|---|---|---|
| CN | 111902906 A | 11/2020 |
| CN | 114864373 A | 8/2022 |

(Continued)

OTHER PUBLICATIONS

International Search Report and Written Opinion mailed Aug. 7, 2024 in co-pending PCT application No. PCT/US2024/022980.

(Continued)

*Primary Examiner* — Andrew Smyth
(74) *Attorney, Agent, or Firm* — Nields, Lemack & Frame, LLC

(57) ABSTRACT

A fastener for securing a faceplate to the chamber walls of an ion source is disclosed. The ion source rests on a source housing having a flange. The fastener includes two straps, which have a cross-section resembling a rounded rectangle. Each strap has two attachment portions and an engagement portion, which rests against an outer surface of the faceplate. The attachment portions pass through openings in the flange and are attached to a tension system that is disposed on the opposite side of the flange. The tension system includes at least one spring associated with each strap to press the faceplate against the tops of the chamber walls. The shape of the straps results in reduced electrostatic stress between the faceplate and the extraction electrode that is located near the faceplate.

17 Claims, 7 Drawing Sheets

(56) References Cited

U.S. PATENT DOCUMENTS

| | | | |
|---|---|---|---|
| 2015/0357152 A1 | 12/2015 | Jones et al. | |
| 2017/0178857 A1* | 6/2017 | Holden | H01J 37/08 |
| 2019/0189387 A1* | 6/2019 | Perel | H01J 37/3007 |
| 2021/0110995 A1 | 4/2021 | Patel et al. | |
| 2022/0122811 A1 | 4/2022 | Mutyala et al. | |
| 2024/0371608 A1 | 11/2024 | Prager et al. | |

FOREIGN PATENT DOCUMENTS

| | | | | | |
|---|---|---|---|---|---|
| JP | 2017-228373 | A | | 12/2017 | |
| KR | 20090029212 | A | * | 3/2009 | H01J 27/08 |
| TW | M374647 | U | * | 2/2010 | |
| TW | 202046364 | A | | 12/2020 | |
| TW | 202129677 | A | | 8/2021 | |

OTHER PUBLICATIONS

International Search Report and Written Opinion mailed Jul. 23, 2024 in corresponding PCT application No. PCT/US2024/022995.

* cited by examiner

FASTENER FOR SECURING FACEPLATE TO ION SOURCE

FIELD

Embodiments of the present disclosure relate to a fastener for securing a faceplate to an ion source.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on a faceplate. The ions are manipulated downstream by a variety of components, including electrodes, acceleration and deceleration stages, and mass analyzers.

One such ion source is an indirectly heated cathode ion source. An indirectly heated cathode (IHC) ion source operates by supplying a current to a filament disposed behind a cathode. The filament emits thermionic electrons, which are accelerated toward the cathode via an applied electric potential, which in turn heats the cathode causing electrons to be emitted into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, referred to as the faceplate. The extraction aperture is located proximate to the center of the arc chamber, through which the ions created in the arc chamber may be extracted.

Typically, the faceplate is a separate component from the rest of the arc chamber. As such, it is secured to the arc chamber. However, the traditional means of securing the faceplate create regions of high electrostatic stress, which may cause arcing to nearby components, such as the extraction electrode.

Therefore, it would be beneficial if there was a fastener that may be used to secure the faceplate to the arc chamber which reduced the electrostatic stress and risk of arcing.

SUMMARY

A fastener for securing a faceplate to the chamber walls of an ion source is disclosed. The ion source rests on a source housing having a flange. The fastener includes two straps, which have a cross-section resembling a rounded rectangle. Each strap has two attachment portions and an engagement portion, which rests against an outer surface of the faceplate. Rounded portions are located between the engagement portion and each attachment portion. The attachment portions pass through openings in the flange and are attached to a tension system that is disposed on the opposite side of the flange. The tension system includes at least one spring associated with each strap to press the faceplate against the tops of the chamber walls. The shape of the straps results in reduced electrostatic stress between the faceplate and the extraction electrode that is located near the faceplate.

According to one embodiment, an ion implantation system is disclosed. The ion implantation system comprises an ion source comprising an arc chamber comprising a plurality of chamber walls and having a first end and a second end; and a faceplate having an extraction aperture disposed on a top of the plurality of chamber walls; a source housing having a flange, wherein the arc chamber is disposed on the source housing; a first strap located near the first end and a second strap located near the second end, each strap having two attachment portions, which pass through respective openings in the flange, and an engagement portion disposed between the two attachment portions, wherein the engagement portion contacts an outer surface of the faceplate; and a tension system disposed on an opposite side of the flange from the ion source, wherein the tension system applies pressure to press the first strap and the second strap against the faceplate to secure the faceplate to the arc chamber. In some embodiments, the faceplate has two grooves located on the outer surface, where the first strap and the second strap are each disposed in a respective groove. In some embodiments, the tension system comprises at least one spring associated with each strap. In certain embodiments, the tension system comprises a retaining block mounted to a distal end of each of the two attachment portions of each strap, and a spring disposed between an underside of the flange and the retaining block. In certain embodiments, the tension system comprises a yoke attached to the two attachment portions of each strap, wherein the yoke comprises two arms that each connect to a respective attachment portion and a central portion located between the two arms, wherein a spring is disposed between an underside of the flange and the central portion of the yoke. In certain embodiments, the tension system further comprises an upper fastener affixed to the source housing beneath the flange and above the central portion of the yoke; a lower fastener disposed beneath the upper fastener and beneath the central portion of the yoke, and a post disposed between the upper fastener and the lower fastener, wherein the post is disposed inside the spring and passes through a hole in the central portion. In certain embodiments, the tension system further comprises guide rails disposed on either side of the post, wherein the guide rails extend from the upper fastener to the lower fastener and pass through respective holes in the central portion. In some embodiments, the source housing has a cylindrical shape, wherein flat regions are created on the source housing, and wherein the upper fastener and the lower fastener are affixed to the flat regions. In some embodiments, each strap comprises rounded portions between the engagement portion and each attachment portion. In certain embodiments, a radius of curvature of the rounded portions is between 0.25 and 1.0 inches. In some embodiments, a cross-section of each strap comprises a rounded rectangle, having a width and a thickness, and wherein sides that define the thickness have a radius of curvature equal to half of the thickness.

According to another embodiment, an assembly for use with an ion source is disclosed, wherein the ion source comprises an arc chamber having a plurality of chamber walls. The assembly comprises a faceplate adapted to be disposed on a top of the plurality of chamber walls, the faceplate having two grooves disposed on an outer surface; and a first strap and a second strap, each having two rounded portions, an engagement portion disposed between the two rounded portions, and two attachment portions, wherein the engagement portion of each strap is configured to be disposed in a respective groove. In some embodiments, the assembly comprises a tension system associated with each strap, such that the first strap and the second strap apply a compression force to the faceplate. In certain embodiments, the tension system comprises a retaining block mounted to a distal end of each of the two attachment portions of each strap, and a spring, wherein the distal end of each of the two attachment portions passes through a center of the spring. In certain embodiments, the tension system comprises a yoke attached to each of the two attachment portions of each strap, wherein the yoke comprises two arms that each connect to a respective attachment portion and a central portion located between the two arms, wherein a spring is disposed so as to bias the central portion of the yoke away from the faceplate. In certain embodiments, a radius of curvature of the rounded portions is between 0.25 and 1.0 inches. In some embodiments, a cross-section of each strap comprises a rounded rectangle, having a width and a thickness, and wherein sides that define the thickness have a radius of curvature equal to half of the thickness.

BRIEF DESCRIPTION OF THE FIGURES

For a better understanding of the present disclosure, reference is made to the accompanying drawings, which are incorporated herein by reference and in which.

DETAILED DESCRIPTION

As described above, the means for securing the faceplate to an arc chamber may create an undesirable amount of electrostatic stress, which may increase the risk of arcing.

Figure 1:
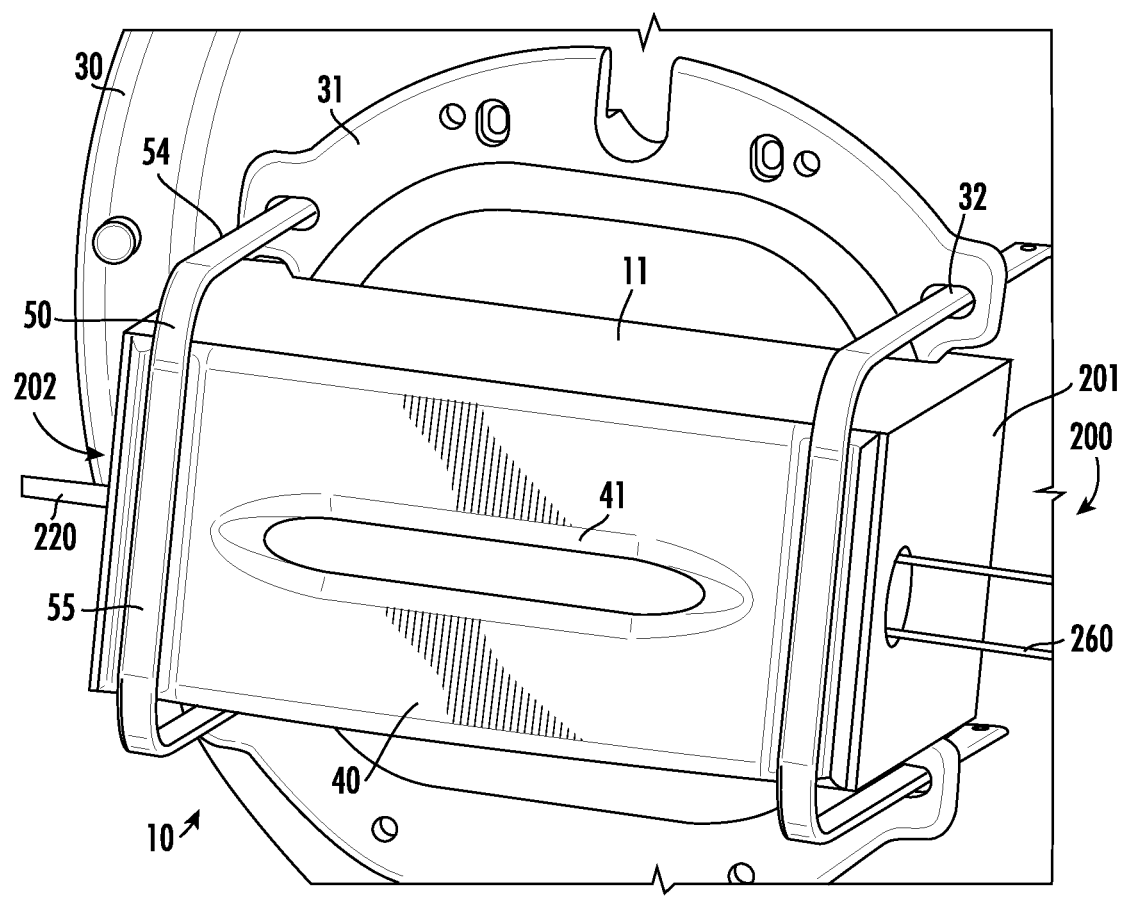
FIG. 1 is a view of the ion source according to one embodiment.

FIG. 1 shows a top view of an ion source with an improved fastener for securing the faceplate according to one embodiment. The ion source 10 includes a plurality of chamber walls 11 that define an arc chamber 200. A faceplate 40 having an extraction aperture 41 may be disposed against the chamber walls 11. The faceplate 40 may be a single component, or may be comprised of a plurality of components. For example, in one embodiment, the faceplate 40 includes a faceplate insert that is disposed beneath the outer faceplate and helps define the extraction aperture 41. Thus, the term "faceplate" as used in this disclosure refers to any component or components that make up the structure that includes the extraction aperture 41 through which the ions are removed. Within the arc chamber 200 may be a mechanism to create ions. For example, in one embodiment, an indirectly heated cathode (IHC) may be disposed within the arc chamber 200.

The faceplate 40 is secured to the source housing 30 using a plurality of straps 50. The source housing 30 may include a flange 31 having holes or slots through which the straps 50 pass. The straps 50 are held in place using a tension system. The arc chamber 200 may be disposed on or attached to the source housing 30. In certain embodiments, the source housing 30 may be temperature controlled. For example, the source housing 30 may be attached to a heat sink, or may be a heat sink itself. Thus, the chamber walls 11 are in direct thermal contact with the source housing 30. This may serve to cool the chamber walls 11.

Figure 2:
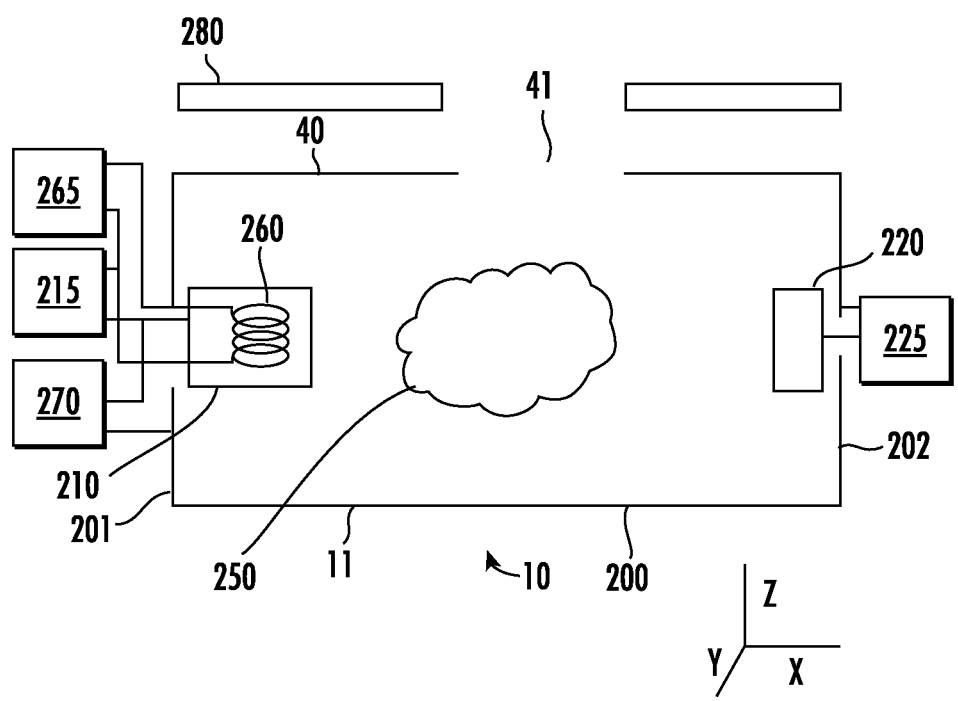
FIG. 2 is a side view of the interior of the ion source of FIG. 1.

FIG. 2 shows a side view of the electronics and interior of the ion source 10 according to one embodiment. In this embodiment, the ion source 10 includes an arc chamber 200, comprising two opposite ends, and chamber walls 11 connecting to these ends. The arc chamber 200 also includes a bottom wall and faceplate 40. The chamber walls 11 may be constructed of an electrically and thermally conductive material and may be in electrical communication with one another. A cathode 210 is disposed in the arc chamber 200 at a first end 201 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 may be electrical biased relative to the arc chamber 200, using cathode power supply 270.

In this embodiment, a repeller 220 is disposed in the arc chamber 200 on the second end 202 of the arc chamber 200 opposite the cathode 210. The repeller 220 may be in communication with repeller power supply 225. As the name suggests, the repeller 220 serves to repel the electrons emitted from the cathode 210 back toward the center of the arc chamber 200. For example, the repeller 220 may be biased at a negative voltage relative to the arc chamber 200 to repel the electrons. For example, the repeller power supply 225 may have an output in the range of 0 to −150V, although other voltages may be used. In certain embodiments, the repeller 220 is biased at between 0 and −150V relative to the arc chamber 200. In other embodiments, the cathode power supply 270 is used to supply a voltage to the repeller 220 as well. In other embodiments, the repeller 220 may be electrically grounded or floating.

In operation, a gas is supplied to the arc chamber 200. The thermionic electrons emitted from the cathode 210 cause the gas to form a plasma 250. Ions from this plasma 250 are then extracted through an extraction aperture 41 in the faceplate 40. The ions are then manipulated to form an ion beam that is directed toward the workpiece. An extraction electrode 280 is disposed outside the arc chamber 200 and proximate the extraction aperture 41. The extraction electrode 280 is biased at a voltage different from the arc chamber 200 so as to attract ions from within the arc chamber 200 through the extraction aperture 41.

It is noted that other mechanisms for generating ions may be used. These other mechanisms include, but are not limited to, Bernas ion source, RF antennas, and capacitively coupled sources.

Thus, in some embodiments such as that shown in FIG. 1, there is a first strap located near the first end 201 of the arc chamber 200 and a second strap located near the second end 202 of the arc chamber 200. The two straps serve to secure the faceplate 40 to the chamber walls 11 of the arc chamber.

Figure 3:
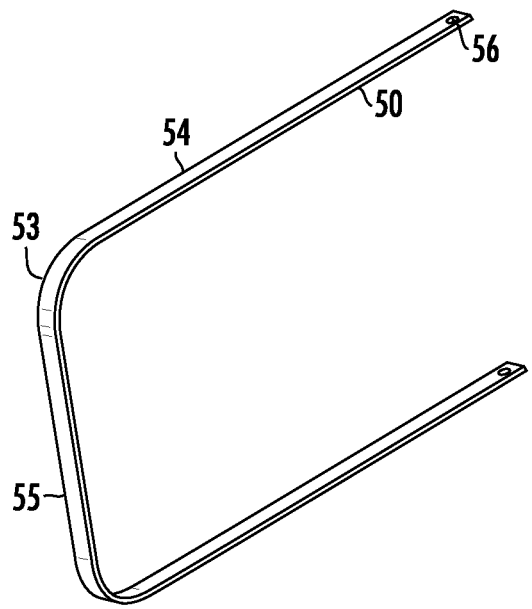
FIG. 3 is a view of one of the straps.

FIG. 3 shows a perspective view of one of the straps 50. Note that the arc chamber 200 may be held in place through the use of two straps 50, which may be identical in dimension and structure.

Figure 4:
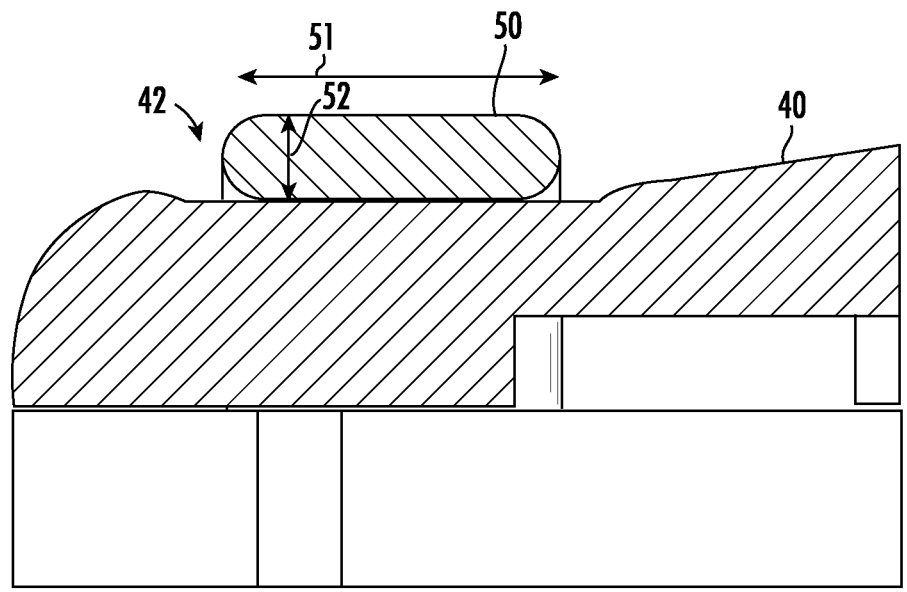
FIG. 4 shows the interface between the faceplate and the strap.

FIG. 4 shows a cross section of the strap 50 mounted on the faceplate 40. The straps 50 may be constructed from tungsten, although other suitable materials may be used. The straps 50 may be formed having a cross-section that is a rounded rectangle. The cross section of the strap 50 has a width 51 and a thickness 52, where the width 51 may be larger than the thickness 52. The width 51 of the straps 50 may be between 0.25 inches and 1 inch, while the thickness 52 may be between $\frac{1}{16}$ and $\frac{1}{4}$ inches. The ends of the rectangular cross section, which define the thickness 52, are rounded, with a diameter that may be equal to the thickness 52 of the strap 50. As best seen in FIG. 3, the strap 50 comprises three straight portions, which are separated by rounded portions 53. The rounded portions 53 may include a bend, having a radius of curvature. The bend may be a 90° bend, although bends between 45° and 135° may also be used. The radius of curvature of the rounded portions 53 may be between 0.25 inches and 1.0 inches. Between the rounded portions 53 is the engagement portion 55. As seen in FIG. 1, the engagement portion 55 of the strap 50 is the portion that rests against the outer surface of the faceplate 40, which is the surface of the faceplate 40 that is closest to the extraction electrode 280. In some embodiments, the length of the engagement portion 55 is slightly longer than the width of the faceplate 40 such that the engagement portion 55 contacts the entirety of the width of the faceplate 40. For example, the engagement portion 55 of the strap 50 may be between 1 and 6 inches, although other dimensions are also possible. On the opposite side of each rounded portion 53 is the attachment portion 54. The attachment portion 54 may have a length that is greater than the height of the arc chamber 200. For example, the attachment portion 54 may have a length that may be between 4 and 10 inches, although other dimensions may also be used. As best seen in FIG. 1, the attachment portions 54 of the straps 50 pass through slots 32 or openings in the flange 31. At least one hole 56 may be disposed near the distal end of each attachment portion 54. This hole 56 may be used to attach the straps 50 to the tension system.

FIG. 4 also shows a groove 42 disposed on the outer surface of the faceplate 40. A groove 42 is disposed on the two opposite sides of the extraction aperture 41, such as near the first end 201 and the second end 202 of the arc chamber 200. The grooves 42 may be formed in a direction that is perpendicular to the wider dimension of the extraction aperture 41. The grooves 42 may have a width which is slightly larger than the width 51 of the strap 50. For example, the groove 42 may be wider than the strap 50 by 0.1 inches or less. Further, the groove 42 may have a depth of up to 0.025 inches, although other depths may be used. The engagement portion 55 of the strap 50 rests in this groove 42.

As noted above, the attachment portions 54 of the straps 50 pass through slots 32 in the flange 31. A tension system is disposed on the side of the flange 31 opposite the arc chamber 200. The tension system may include springs which are used to apply pressure to the straps 50, causing them to press the faceplate 40 against the tops of the chamber walls 11. The tension system may be constructed in a plurality of ways. For example, the tension system may be configured such that one spring is associated with each attachment portion 54. In another embodiment, the tension system may be configured such that one spring is associated with each strap 50.

Figure 5A:
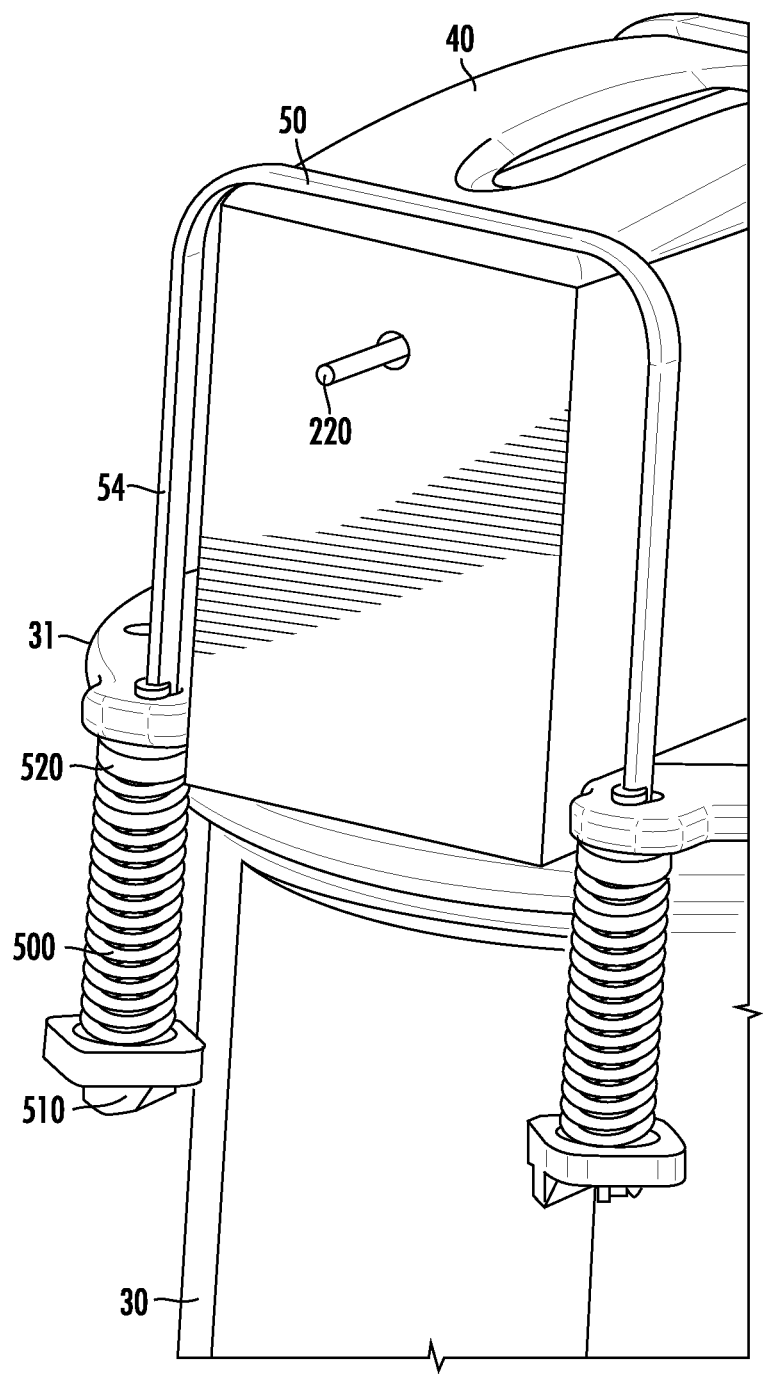
FIG. 5A-5B show a tension system for the straps according to one embodiment.
Figure 5B:
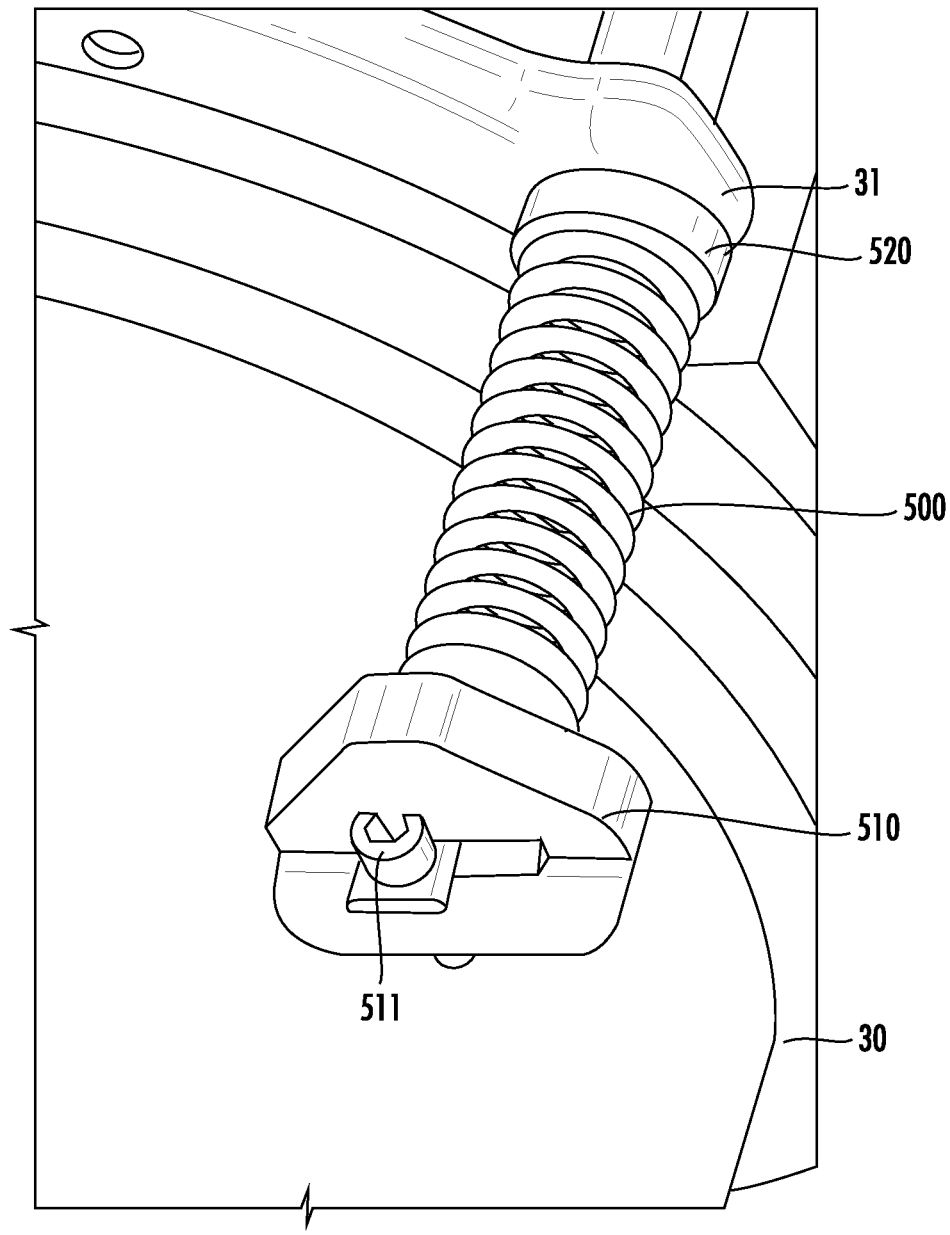

FIGS. 5A-5B show a first embodiment of a tension system. In this embodiment, a spring 500 is used for each attachment portion 54 of each strap 50. As best seen in FIG. 5B, a screw 511 or other fastener may pass through the hole 56 in the attachment portion 54 and hold the retaining block 510. The spring 500 is disposed between the underside of the flange 31 and the retaining block 510. The spring 500 exerts a downward force on the retaining block 510, which causes the strap 50 to tighten against the faceplate 40. The distance between the underside of flange 31 and the retaining block 510 is less than the free length of spring 500, ensuring downward force on the faceplate 40. This distance may be varied to achieve a desired compression force on the faceplate 40. For example, in one embodiment, there may be multiple holes 56 on the attachment portion 54 of each strap 50, such that the hole 56 which is used to connect the strap 50 to retaining block 510 determines the compression force. In some embodiments, a washer 520 may be disposed between the underside of the flange 31 and the spring 500. The washer 520 may be constructed from aluminum oxide (alumina) or another suitable material.

Figure 6:
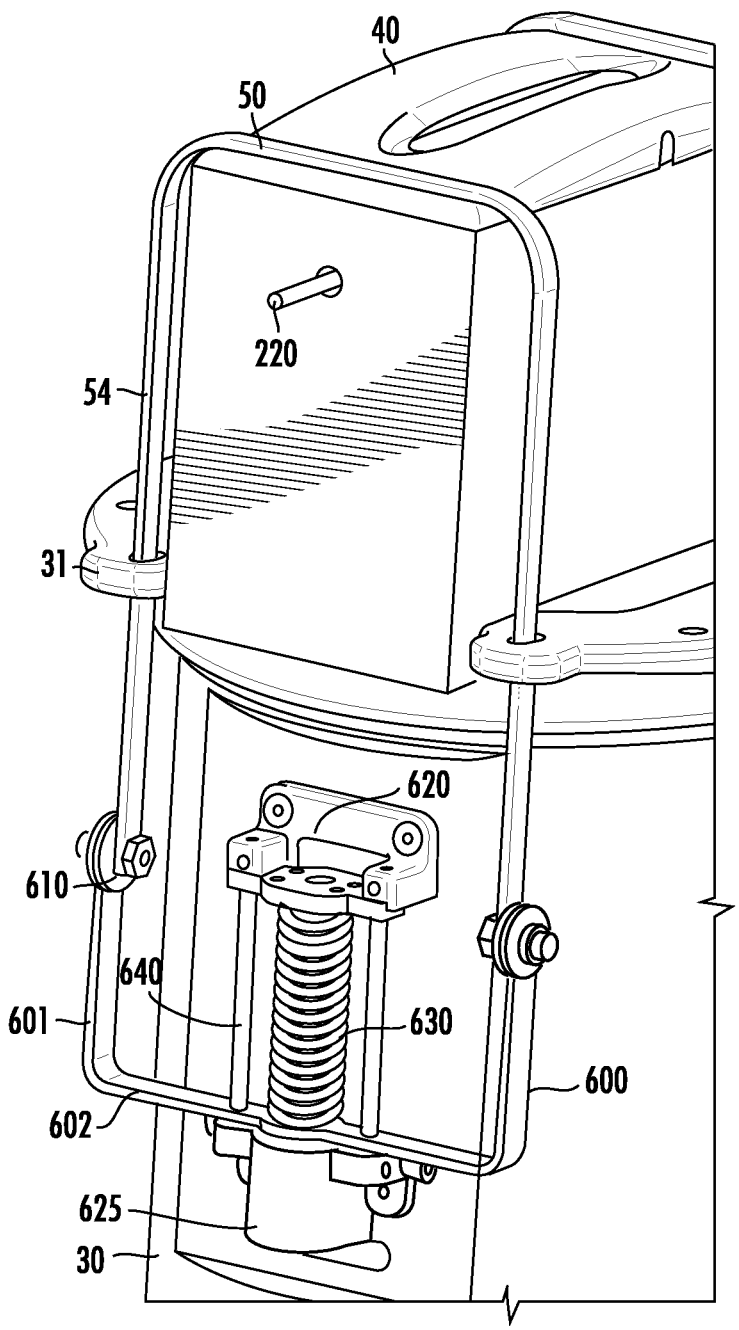
FIG. 6 shows a tension system for the straps according to another embodiment.

FIG. 6 shows a second embodiment of a tension system. In this embodiment, one spring is used for each strap 50. The two ends of the attachment portions 54 of each strap 50 are connected to a yoke 600, such as through the use of a screw or other fastener 610. The yoke 600 may include two arms 601 that extend toward the attachment portions 54 of the strap 50. Additionally, the yoke 600 may include a central portion 602 that connects the two arms 601. A spring 630 is disposed between the flange 31 and the central portion 602. In some embodiments, the central portion 602 may include one or more holes to accommodate guide rails 640. The central portion 602 may also include another hole to accommodate a post that passes between an upper fastener 620 and a lower fastener 625. In some embodiments, the upper fastener 620 is affixed to the source housing 30 below the flange 31 and above the yoke 600. The lower fastener 625 is affixed to the source housing 30 below the yoke 600. A post may be disposed between the upper fastener 620 and the lower fastener 625. A spring 630 may be located such that the post passes through the center of the spring 630. The first end of the spring 630 contacts the underside of the upper fastener 620 and the second end of the spring 630 contacts the central portion 602 of the yoke 600. The distance between the underside of upper fastener 620 and the central portion 602 of the yoke 600 is less than the free length of spring 630, ensuring downward force on the faceplate 40. This distance may be varied to achieve a desired compression force on the faceplate 40, based on the mounting location of the upper fastener or the length of the arms 601 of the yoke 600. For example, in one embodiment, there may be multiple holes 56 on the attachment portion 54 of each strap 50, such that the hole 56 which is used to connect the strap 50 to the arm 601 determines the compression force. Additionally, guide rails 640 may be disposed between the upper fastener 620 and the lower fastener 625, passing through holes in the central portion 602. These guide rails 640 provide stability. The spring 630 exerts a downward force on the central portion 602 of the yoke 600, which in turn causes the arms 601 to pull the attachment portions 54 of the strap 50 downward, pressing the strap 50 against the faceplate 40.

Figure 7:
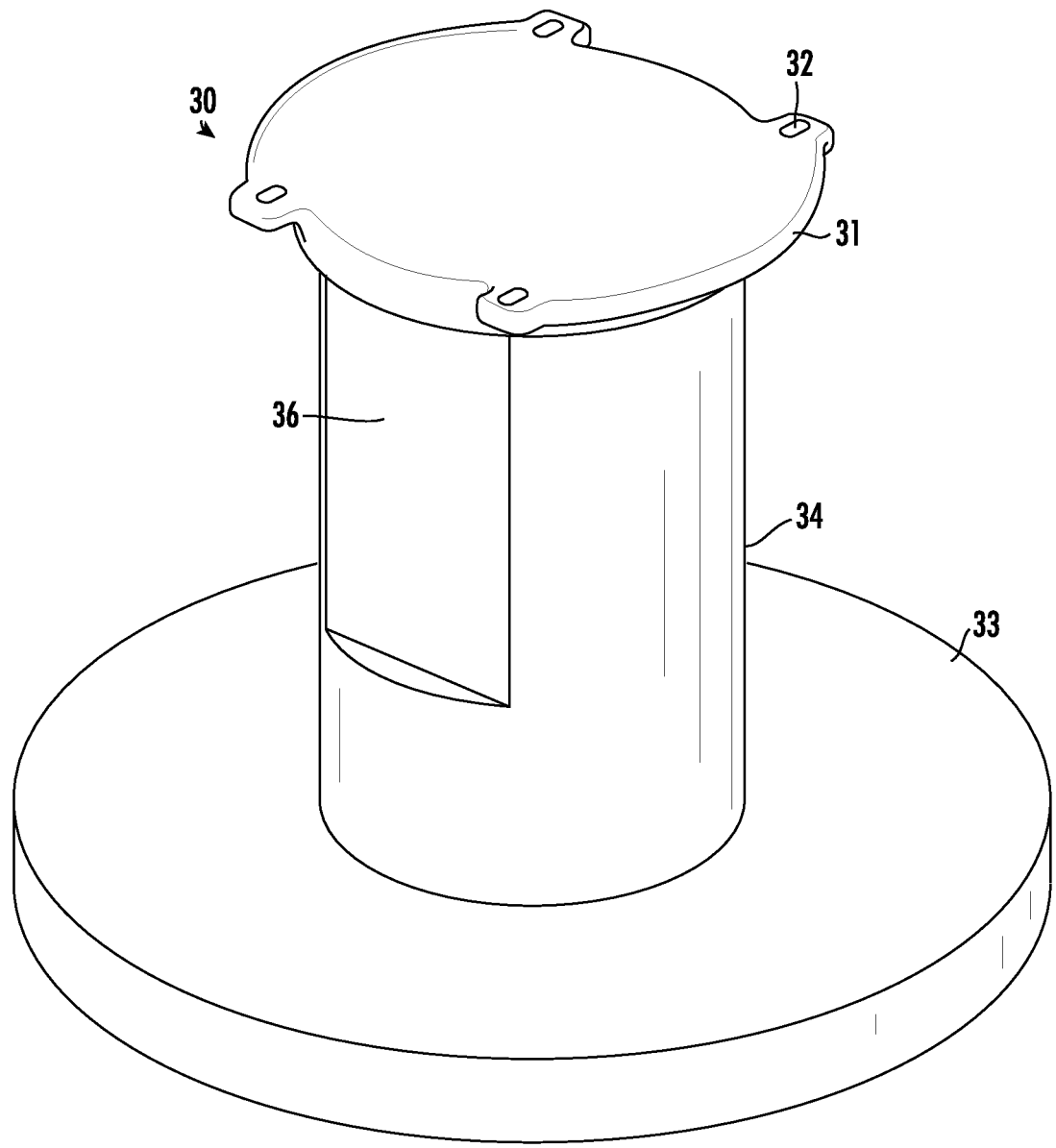
FIG. 7 shows a source housing for use with the tension system shown in FIG. 6.

FIG. 7 shows the source housing 30 of FIG. 6 in more detail. As described above, the source housing 30 has a flange 31 located at or proximate the top surface. The flange 31 has a plurality of openings or slots 32, through which the straps 50 pass. In certain embodiments, there may be a total of four slots 32. The bottom of the source housing 30 may include a lower flange 33. The source housing 30 include a housing body 34, which is defined as the region between the flange 31 and the lower flange 33. In certain embodiments, the interior of the housing body 34 may be hollow, allowing the inclusion of components. The exterior of the housing body 34 may be cylindrical. Two regions, located on opposite sides of the housing body 34 may be machined so as to form flat surfaces 36. The flat surfaces 36 create a location where each tension system may be mounted. The flat surfaces 36 may have a width ranging between 1 and 3 inches and a height ranging between 2 and 5 inches, although other dimensions are also possible.

The embodiments described above in the present application may have many advantages. In one simulation, the straps 50 described herein are compared to traditional hooks that are used to hold the faceplate. The hooks are secured into pockets located on the outer surface of the faceplate. Because of their configuration, these hooks may have a bend of more than 90° and a radius of curvature that may be less than 0.2 inches. A simulation of electrostatic stress was performed for both designs. The simulation assumed that an extraction electrode was disposed 1 inch from the faceplate 40 and was biased at a voltage that was 30 kV less than that of the faceplate 40. Because the hooks have a small radius of curvature near the faceplate, a localized region of high electrostatic stress is created. In contrast, the design of the straps increases the radius of curvature. It was found that the maximum electrostatic stress was at least 15% less for the straps 50 described herein. This reduction in electrostatic stress may result in a reduction in the risk of arcing between the straps and the extraction electrode, resulting in higher throughput and higher system availability.

Further, the embodiment of FIG. 6 offers additional benefits. By utilizing a single spring per strap 50, the possible variation in faceplate tension may be reduced in several ways. First, the spring shown in FIG. 6 is further from the arc chamber 200 than the springs in FIGS. 5A-5B. This presents a reduced thermal load on the spring, which may result in less possible variation in spring constant due to thermal expansion/contraction. Additionally, one spring is used per fastener rather than two. Each spring has a manufactured tolerance. Assume that the two springs associated with one fastener are manufactured at the high end on the tolerance and the two springs associated with the other strap are manufactured at the low end of the tolerance. In this scenario, there is a difference between the two ends. In contrast, if there is only one spring per side, this maximum difference would be only half of the difference that occurs with four springs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
   an ion source comprising:
      an arc chamber comprising a plurality of chamber walls and having a first end and a second end; and
      a faceplate having an extraction aperture disposed on a top of the plurality of chamber walls;
   a source housing having a flange, wherein the arc chamber is disposed on the source housing;
   a first strap located near the first end and a second strap located near the second end, each strap having two attachment portions, which pass through respective openings in the flange, and an engagement portion disposed between the two attachment portions, wherein the engagement portion contacts an outer surface of the faceplate; and
   a tension system disposed on an opposite side of the flange from the ion source, wherein the tension system applies pressure to press the first strap and the second strap against the faceplate to secure the faceplate to the arc chamber.

2. The ion implantation system of claim 1, wherein the faceplate has two grooves located on the outer surface, where the first strap and the second strap are each disposed in a respective groove.

3. The ion implantation system of claim 1, wherein the tension system comprises at least one spring associated with each strap.

4. The ion implantation system of claim 3, wherein the tension system comprises a retaining block mounted to a distal end of each of the two attachment portions of each strap, and a spring disposed between an underside of the flange and the retaining block.

5. The ion implantation system of claim 3, wherein the tension system comprises a yoke attached to the two attachment portions of each strap, wherein the yoke comprises two arms that each connect to a respective attachment portion and a central portion located between the two arms, wherein a spring is disposed between an underside of the flange and the central portion of the yoke.

6. The ion implantation system of claim 5, wherein the tension system further comprises:
   an upper fastener affixed to the source housing beneath the flange and above the central portion of the yoke;
   a lower fastener disposed beneath the upper fastener and beneath the central portion of the yoke, and
   a post disposed between the upper fastener and the lower fastener, wherein the post is disposed inside the spring and passes through a hole in the central portion.

7. The ion implantation system of claim 6, wherein the tension system further comprises guide rails disposed on either side of the post, wherein the guide rails extend from the upper fastener to the lower fastener and pass through respective holes in the central portion.

8. The ion implantation system of claim 6, wherein the source housing has a cylindrical shape, wherein flat regions are created on the source housing, and wherein the upper fastener and the lower fastener are affixed to the flat regions.

9. The ion implantation system of claim 1, wherein each strap comprises rounded portions between the engagement portion and each attachment portion.

10. The ion implantation system of claim 9, where a radius of curvature of the rounded portions is between 0.25 and 1.0 inches.

11. The ion implantation system of claim 1, wherein a cross-section of each strap comprises a rounded rectangle, having a width and a thickness, and wherein sides that define the thickness have a radius of curvature equal to half of the thickness.

12. An assembly for use with an ion source, wherein the ion source comprises an arc chamber having a plurality of chamber walls, the assembly comprising:
   a faceplate adapted to be disposed on a top of the plurality of chamber walls, the faceplate having two grooves disposed on an outer surface; and
   a first strap and a second strap, each having two rounded portions, an engagement portion disposed between the two rounded portions, and two attachment portions, wherein the engagement portion of each strap is configured to be disposed in a respective groove.

13. The assembly of claim 12, further comprising a tension system associated with each strap, such that the first strap and the second strap apply a compression force to the faceplate.

14. The assembly of claim 13, wherein the tension system comprises a retaining block mounted to a distal end of each of the two attachment portions of each strap, and a spring, wherein the distal end of each of the two attachment portions passes through a center of the spring.

15. The assembly of claim 13, wherein the tension system comprises a yoke attached to each of the two attachment portions of each strap, wherein the yoke comprises two arms that each connect to a respective attachment portion and a central portion located between the two arms, wherein a spring is disposed so as to bias the central portion of the yoke away from the faceplate.

16. The assembly of claim 12, where a radius of curvature of the two rounded portions is between 0.25 and 1.0 inches.

17. The assembly of claim 12, wherein a cross-section of each strap comprises a rounded rectangle, having a width and a thickness, and wherein sides that define the thickness have a radius of curvature equal to half of the thickness.

* * * * *